United States Patent
Bonnin et al.

(10) Patent No.: US 9,829,721 B2
(45) Date of Patent: Nov. 28, 2017

(54) METHOD FOR DETERMINING A VISUAL EFFECT OF AN OPHTHALMIC LENS

(71) Applicant: Essilor International (Compagnie Generale d'Optique), Paris (FR)

(72) Inventors: Thierry Bonnin, Charenton-le-Pont (FR); Marc Lerenard, Laval (FR)

(73) Assignee: Essilor Internaional (Compagnie Générale d'Optique), Charenton-le-Pont (FR)

( * ) Notice: Subject to any disclaimer, the term of this patent is extended or adjusted under 35 U.S.C. 154(b) by 0 days.

(21) Appl. No.: 14/905,693

(22) PCT Filed: Jul. 18, 2014

(86) PCT No.: PCT/EP2014/065480
§ 371 (c)(1),
(2) Date: Jan. 15, 2016

(87) PCT Pub. No.: WO2015/007878
PCT Pub. Date: Jan. 22, 2015

(65) Prior Publication Data
US 2016/0154255 A1    Jun. 2, 2016

(30) Foreign Application Priority Data
Jul. 18, 2013 (EP) .................... 13306030

(51) Int. Cl.
*G06K 9/00* (2006.01)
*G02C 7/02* (2006.01)
(Continued)

(52) U.S. Cl.
CPC .............. *G02C 7/028* (2013.01); *G01M 11/02* (2013.01); *G06F 17/5009* (2013.01);
(Continued)

(58) Field of Classification Search
CPC ........ G02C 7/028; G02C 7/104; G02C 7/107; G02C 7/105; G01M 11/02;
(Continued)

(56) References Cited

U.S. PATENT DOCUMENTS 6,517,201 B2   2/2003 Qi
7,733,497 B2 * 6/2010 Yun ...................... A61B 5/0059
                                                          356/479
(Continued)

FOREIGN PATENT DOCUMENTS

EP    1892661 A1    2/2008
JP    H11-142797 A  5/1999
(Continued)

OTHER PUBLICATIONS

International Search Report and Written Opinion dated Oct. 27, 2014; PCT International Application No. PCT/EP2014/065480.

*Primary Examiner* — Ali Bayat
(74) *Attorney, Agent, or Firm* — McGuireWoods LLP

(57) ABSTRACT

A method implemented by computer means for determining a visual effect of an ophthalmic lens, the method comprising: —an optical data receiving step (S1), during which optical data relating to the optical function of an ophthalmic lens is received, —an acquisition step (S2), during which at least one image of the visual environment of a user is acquired, —a depth map determining step (S3), during which a depth map of the acquired image of the visual environment of the user is determined, —a visual effect determining step (S4), during which based on the depth map and the optical data, a visual effect that would be introduced by the ophthalmic lens if the visual environment was seen through the ophthalmic lens is determined.

14 Claims, 2 Drawing Sheets

Figure 1:
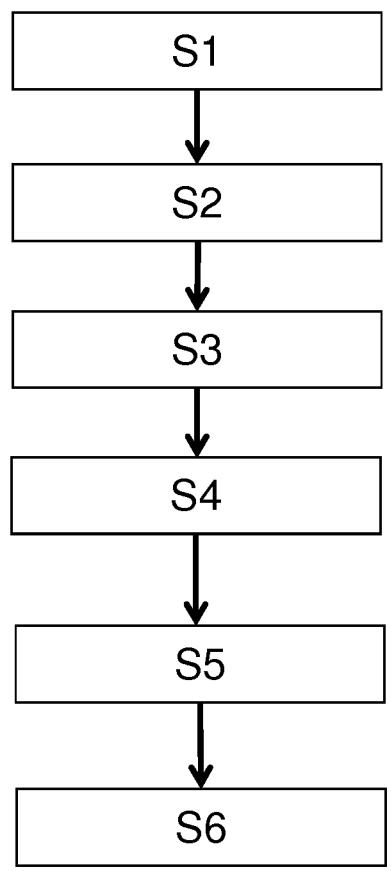

(51) Int. Cl.
*G01M 11/02* (2006.01)
*G06F 17/50* (2006.01)
*G06T 15/06* (2011.01)
*G06T 15/20* (2011.01)
*G09B 23/22* (2006.01)
*H04N 13/00* (2006.01)
*H04N 13/02* (2006.01)

(52) U.S. Cl.
CPC .............. *G06T 15/06* (2013.01); *G06T 15/20* (2013.01); *G09B 23/22* (2013.01); *H04N 13/0022* (2013.01); *H04N 13/0055* (2013.01); *H04N 13/0239* (2013.01); *H04N 13/0271* (2013.01)

(58) Field of Classification Search
CPC ........... H04N 13/0271; H04N 13/0055; H04N 13/0022; H04N 13/0239
See application file for complete search history.

(56) References Cited

U.S. PATENT DOCUMENTS

| | | | |
|---|---|---|---|
| 9,113,043 B1* | 8/2015 | Kim | ........................ H04N 13/02 |
| 2010/0114540 A1 | 5/2010 | Shinohara et al. | |
| 2010/0179799 A1 | 7/2010 | Shinohara et al. | |
| 2012/0249836 A1* | 10/2012 | Ali | .......................... G06T 5/003 |
| | | | 348/239 |
| 2015/0309264 A1* | 10/2015 | Abovitz | ................... G02B 6/34 |
| | | | 385/33 |

FOREIGN PATENT DOCUMENTS

| JP | 2000-047153 A | 2/2000 |
|---|---|---|
| WO | 2007/043036 A1 | 4/2007 |
| WO | 2007/056795 A1 | 5/2007 |
| WO | 2013/027755 A1 | 2/2013 |

* cited by examiner

METHOD FOR DETERMINING A VISUAL EFFECT OF AN OPHTHALMIC LENS

The invention relates to a method for demonstrating to a user the visual effect of an ophthalmic lens, a method for comparing two ophthalmic lenses, an ophthalmic lens ordering method and a computer program product.

The discussion of the background of the invention herein is included to explain the context of the invention. This is not to be taken as an admission that any of the material referred to was published, known or part of the common general knowledge at the priority date of any of the claims.

Usually, a person needing to wear spectacles and having thus a prescription filled by an ophthalmologist goes to the premise of an optician for choosing a pair of specific ophthalmic lenses. For a given prescription, different ophthalmic lenses with different optical designs may be provided. The different designs may provide different level of visual comfort to the potential wearer.

Therefore, it is important to provide to the potential wearer a demonstration of the visual effect of the different optical design available for his or her ophthalmic prescription.

EP2230988 discloses a method for demonstration the visual effects of ophthalmic lenses. Such method consists in simulating at least part of the optical effect, in particular the blur, of an ophthalmic lens over computer generated images.

Such system is expensive to implement, requires sophisticated equipment and is not portable.

EP2198769 discloses a method and an apparatus for demonstrating the optical effects of ophthalmic lenses. The method consists in using a camera equipped of an ophthalmic lens having a given optical design to film a scene. The images of the scene are displayed so as to provide to the potential wearer a demonstration of the optical effect of such optical lens.

Such method is limited by the number of different optical lens that may be tested by the potential wearer. Indeed, the method requires having physically an optical lens. Therefore, the number of optical lenses that may be tested is limited.

Thus, it appears that there is a need for a method for determining the visual effect of an ophthalmic lens that does not have the above mentioned drawbacks, in particular that would be carried out on real world scene and that would not require having a great number of ophthalmic lenses.

A goal of the present invention is to provide such a method.

To this end, the invention proposes a method, for example implemented by computer means, for determining a visual effect of an ophthalmic lens, the method comprising:
- an optical data receiving step, during which optical data relating to the optical function of an ophthalmic lens is received,
- an acquisition step, during which at least an image of the visual environment of a user is acquired,
- a depth map determining step, during which a depth map of the acquired image of the visual environment of the user is determined,
- a visual effect determining step, during which based on the depth map and the optical data, a visual effect that would be introduced by the ophthalmic lens if the visual environment was seen through the ophthalmic lens is determined.

Advantageously, the method according to the invention allows determining the optical effect, for example the blur, of an ophthalmic lens over the real world. Furthermore, since the method according to the invention does not require using physical optical lenses, the number of different optical designs that may be demonstrated using the method of the invention is not limited.

According to further embodiments of the method for determining the visual effect of an ophthalmic lens which can be considered alone or in any possible combination:
- the visual effect comprises the blur and/or the distortion that would be introduced by the ophthalmic lens if the visual environment was seen through the ophthalmic lens is determined; and/or
- the depth map determining step comprises an occlusion filling step during which at least part of the occlusions of the depth map are filled; and/or
- the optical data comprises the optical power map of the ophthalmic lens; and/or
- the visual effect determining step the visual effect is determined by combining the depth map and the optical power map; and/or
- the acquisition step, the depth map determining step, the visual effect determining step, are repeated with a frequency of at least 15 Hz; and/or
- during the acquisition step at least two images of the visual environment of the user are acquired from two different acquisition points.

The invention further relates to a method for demonstrating to a user the visual effect of an ophthalmic lens, the method comprising:
- a visual effect determining step during which the visual effect of the ophthalmic lens is determined using a method according to the invention,
- a visual environment adapting step, during which an adapted visual environment image is determined based on the combination of the image of the visual environment acquired during the acquisition step and the visual effect determined during the visual effect determining step,
- a display step, during which the adapted visual environment image is displayed to the user.

According to further embodiments of the method for demonstrating the visual effect of an ophthalmic lens which can be considered alone or in any possible combination:
- the optical data comprises a distortion map of the ophthalmic lens and during the visual environment adapting step, the adapted visual environment image is based on the combination of the image of the visual environment acquired during the acquisition step, the visual effect determined during the visual effect determining step and the distortion map comprised in the optical data; and/or
- prior to the optical data receiving step an ophthalmic lens selecting step during which the type of ophthalmic lens to demonstrated is selected among a list of ophthalmic lenses and the optical data related to the optical function of the selected ophthalmic lens; and/or
- the acquisition step, the depth map determining step, the visual effect determining step, the visual environment adapting step, and the display step, are repeated with a frequency of at least 15 Hz.

The invention also relates to a method for comparing at least two ophthalmic lenses, comprising the steps of demonstrating to the user the visual effects of at least two ophthalmic lenses using a method according to the invention.

The invention further relates to a method of ordering an ophthalmic lens, comprising the steps of:
comparing at least two ophthalmic lenses according to a method of the invention, selecting an ophthalmic lens among the compared ophthalmic lenses, sending to a lens provider an order request comprising at least a reference of the ophthalmic lens selected and a reference of the ophthalmic prescription of the wearer.

According to a further aspect, the invention relates to a computer program product comprising one or more stored sequences of instructions that are accessible to a processor and which, when executed by the processor, causes the processor to carry out the steps of the method according to the invention.

The invention further relates to a computer readable medium carrying one or more sequences of instructions of the computer program product according to the invention.

Furthermore, the invention relates to a program which makes a computer execute the method of the invention.

The invention also relates to a computer-readable storage medium having a program recorded thereon; where the program makes the computer execute the method of the invention.

The invention further relates to a device comprising a processor adapted to store one or more sequence of instructions and to carry out at least one of the steps of the method according to the invention.

Unless specifically stated otherwise, as apparent from the following discussions, it is appreciated that throughout the specification discussions utilizing terms such as "computing", "calculating", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computer or Digital Signal Processor ("DSP") selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions, and capable of being coupled to a computer system bus.

The processes and displays are not inherently related to any particular computer or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

Figure 2:
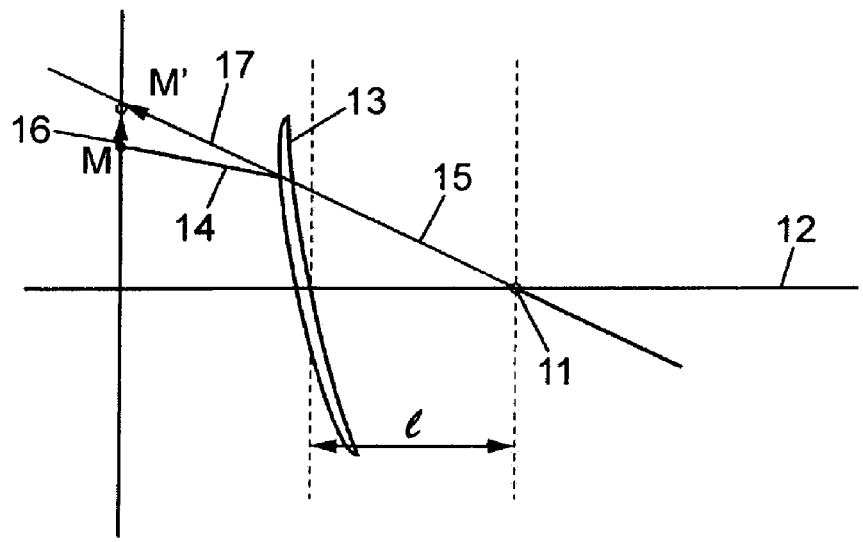
Figure 3:
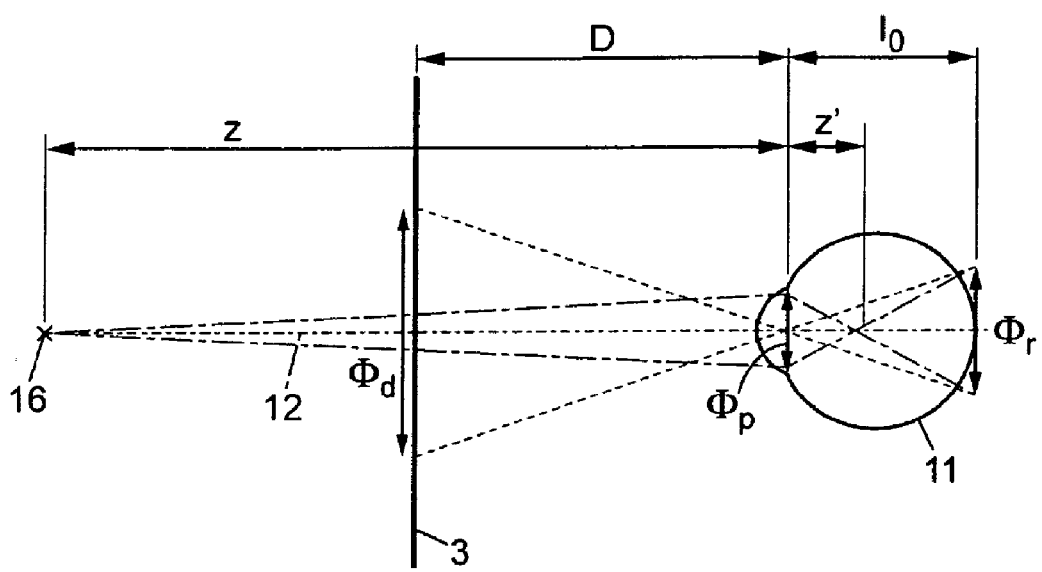

Non limiting embodiments of the invention will now be described with reference to the accompanying drawing in which:

FIG. 1 is flowchart representing the steps of a method according to an embodiments of the invention, FIG. 2 is a diagram illustrating an optical path used to generate images in the method according to the invention, FIG. 3 is a diagram illustrating the spatial relationships between an object of the visual environment of the user, a user's eye and an ophthalmic lens.

According to an embodiment of the invention illustrated on FIG. 1, the method of the invention is a method for demonstrating to a user the visual effect, in particular the blur effect of an ophthalmic lens comprises:

an optical data receiving step S1,
an acquisition step S2,
a depth map determining step S3,
a blur determining step S4,
a visual environment adapting step S5,
a display step S6.

During the optical data receiving step S1, optical data relating to the optical function of an ophthalmic lens is received.

The optical function comprises the optical features of the ophthalmic lens, among which the power and cylinder distribution and the spectral transmission of the ophthalmic lens.

More specifically, the optical data comprise an optical power map of the ophthalmic lens of which the optical effect is to be demonstrated.

During the acquisition step S2, at least one image of the visual environment of the wearer is acquired.

The image of the visual environment may be acquired using a conventional camera, charge-coupled device (CCD), complementary metal-oxide-semiconductor (CMOS), or other photonic detectors that include an active area, e.g. including a rectangular or other array of pixels, for capturing images and/or generating video signals representing images.

According to a preferred embodiment, the image of the visual environment is acquired using two camera placed at two different acquisition point. For example, the inventors have implemented the method of the invention using a Kinect device. The idea is to have two acquisitions points so as to obtain a binocular vision of the visual environment.

During the depth map determining step S3, a depth map of the visual environment corresponding to the image of the visual environment is determined. The depth map is a 2 dimensions image showing the distance to points of the visual environment from a specific point corresponding to the user's eyes.

The depth map may be determined using any range imaging technology.

A stereo camera system can be used for determining the depth map of the visual environment, for example, from the center point of the line between the focal points of the stereo camera.

So as to determine the depth of points of the visual environment the corresponding points in the different images are found and compared.

The idea is to relate the disparities of the images obtained by both cameras to the proximity of the objects in the visual environment. For example, each point of the image obtained by the first camera is matched with a point of the image obtained by the second camera. From such matching process it is possible to determine a point-by-point disparity map of the visual environment of the user. A point-by-point depth map of the visual environment can be determined based on the disparity map.

The inventors have obtained good results using the Kinect device developed by the company PrimeSense. The Kinect is a system comprising:

(a) an illuminating unit, comprising a coherent light source and a generator of a random speckle pattern accommodated in the optical path of illuminating light propagating from the light source towards an object, thereby projecting onto the object a coherent random speckle pattern; and (b) an imaging unit for detecting a light response of an illuminated region and generating image data, the image data being indicative of the object with the projected speckles pattern and thus indicative of a shift of the pattern in the image of the object relative to a reference image of said pattern, the system thereby enabling real-time reconstruction of a three-dimensional map of the object.

The Kinect system is disclosed in detailed in WO2007043036.

Advantageously, this technology may be carried out independently of the illuminations conditions.

According to further embodiments of the invention, the depth map is obtain by other means, for example using specific depth map determining devices, such a sonar type device, radar type device, Lidar type device such as a time-of-flight camera.

A time-of-flight camera is a range imaging camera system that resolves distance based on the known speed of light, measuring the time-of-flight of a light signal between the camera and each point of the visual environment of the user.

The depth map determined may comprise occlusions, i.e. points of the visual environment for which no depth has been determined, in particular this may occur for parts of the image of the visual environment that are hidden by the shadow of other elements of the environment.

Therefore, the method according to the invention may further comprise an occlusion filling step during which at least part, for example at least 75%, preferably at least 90%, of the occlusions of the depth map are filled.

Many algorithms for filling such occlusions are available. For example, one may use algorithms based on mathematical morphology operations.

Among the number of algorithm tested by the inventors, algorithms based on the classification of areas to be filled have proven to provide good results, and in particular to be compatible with a real-time version of the method of the invention.

The classification criterion takes into account the fact that the two cameras used for the acquisition of the depth map are shifted and it appears on the map provided by the shading system. The position of the shadow relative to the object is known.

The shadow appears to the left of a "close" object when it hides a "distant" object. Therefore, if the pixel from the left edge of the area is deeper than the right edge then we can assume that this is a gray area.

The inventors have obtain particularly good results using such type of algorithms and in particular have been able to obtain depth map with filled occlusions at a frequency of 30 Hz, allowing a real-time version of the method according to the invention.

After a depth map of the visual environment has been determined, the visual effect of the ophthalmic lens may be determined. In the specific embodiment described in detail the blur effect of the ophthalmic lens is determined.

During the blur determining step S4, the blur that would be introduced by the ophthalmic lens if the visual environment was seen through the ophthalmic lens is determined. The blur is determined based on the depth map and the optical data.

More generally, the optical effects are generated as a function of a given lens design.

A method to calculate optical effects may use ray tracing as illustrated in FIG. 2. The center of rotation of the eye is referred as 11, the viewing axis as 12, and the lens as 13. The parameter l denotes the distance between the optical center of the lens and the center of rotation of the eye 11. An incident ray 14, coming from an object 16 located at a point M in the scene 2, is deviated by refraction through the lens 13 to form a ray 15 converging to the center of rotation C of the eye 11, so that the viewer has the feeling that the ray comes from a point M' as ray 17.

To take into account the lens design, corresponding distortion is introduced as a vector MM' and the initial point M is shifted to point M'.

In a known manner, as a result of these computational steps, the computer system obtains a first image I(x, y) for each eye which will generally be a sharp image. Such an image includes certain distortions as usually perceived by wearers of correction lenses, e.g. straight lines looking curved in peripheral vision, etc. However, the ray tracing technique determining offsets such as MM' in FIG. 2 normally does not reproduce blurring effects due defocusing. In order to demonstrate blur, some other technique must be used to process the first images. Different embodiments of such technique are discussed below.

As indicated previously, the depth map associate to pixel locations (x, y) in the image I(x, y) of the visual environment a depth z(x,y). The depth z(x, y) associated with a pixel location (x, y) represents the distance of the viewer's eye 11 to the object 16 of the scene appearing at this pixel location in I(x, y). From the distribution of the distance parameter z(x, y), the spatial data and the lens design parameters, one may evaluate the distribution of a spreading parameter $\Phi_d(x,y)$.

FIG. 3 shows spatial relationships between a point object 16 whose position is known in the visual environment, a viewer's eye 11 and a surface 3 corresponding in our case to the ophthalmic lens.

The distance z corresponds to the distance between the user's eye (pupil) and the object 16. The distance D corresponds to the distance between the user's eye (pupil) and the portion of the ophthalmic lens 3 through which the object 16 will be seen by the user. The parameter $I_0$ denotes the distance between the pupil and the retina.

The surface 3 illustrated on FIG. 3 does not show a simulated correction lens, for simplicity. Depending on the optical power of any simulated correction lens in the direction of the viewing axis 12, the focus of the combined optical system including the correction lens and the cornea and crystalline lenses of the eye 11 is located at a distance z' from the pupil. Perfect focusing of an object at infinity on the retina occurs when $z'=I_0$. The point object 16 at distance z is imaged on the retina as a spot of diameter $$\phi_r \simeq \phi_p \left| 1 - \frac{I_0}{z'} \right|,$$

as illustrated by the dash-dot line in FIG. 3, where $\Phi_p$ designates the diameter (aperture) of the pupil. Approximately the same spot occurs on the retina if the point object 16 is displayed on the surface 3 with a diameter of $$\phi_d \simeq \phi_r \left| \frac{D}{I_0} \right|$$

as illustrated by the dashed line in FIG. 3.

The object 16 is represented on the surface 3 as extending over a blur region whose diameter $\Phi_d$ can be referred to as the spreading parameter for the pixel location where the object 16 is located. If there is no correction lens, the spreading parameter $\Phi_d$ can be estimated as: $\phi_d \simeq \phi_p D/z$ Each portion of the ophthalmic lens as placed along a ray extending between the viewer's eye 11 and the object 16 is associated with a local value of the dioptric power Pcorr which is used to derive the value of the spreading parameter $\Phi_d$ determined for the pixel location at which the object 16 appears in the image. In particular, the spreading parameter $\Phi_d$ can be approximated as:

$$\phi_d \simeq \phi_p D \left( \frac{1}{z} + Pcorr \right).$$

The proportionality to $$\left( \frac{1}{z} + Pcorr \right),$$

provides a good approximation of the combined effect of the distance z to the object and of the simulated dioptric power Pcorr of the ophthalmic lens.

In the case of the invention the distance D is set as the blur is applied to the ophthalmic lens that remains at a constant distance from the center of rotation of the eye (CRO). This distance can be set at 27 mm. As the CRO is assumed to be at 10 mm of the pupil, the distance D is 17 mm. The distance between the CRO and the pupil may be considered as a variable parameter of the function.

Assuming that the user is total presbyopia without accommodation, the spreading parameter can be approximated as:

$$\phi_d \simeq \phi_p D \left( \frac{1}{z} - Pv \right),$$

with Pv the optical power of the ophthalmic lens related to Pcorr by: Pcorr=Pwearer−Pv.

According to an embodiment of the invention, the astigmatism of the ophthalmic lens is considered when calculating the blur. According to such embodiment, the optical power map comprises for each point of the ophthalmic lens the optical power, the value of astigmatism and a direction of astigmatism.

In other words, $$\left( \frac{1}{z} - Pv \right)$$

shall nave different values depending on the direction. The spreading parameter shall also have different values depending on the direction.

$$\phi_d \simeq \phi_p D \left( \frac{1}{z} - Pv \right) - Ast/2 \text{ along the semi-minor axis of the astigmatism ellipse,}$$

and $$\phi_d \simeq \phi_p D \left( \frac{1}{z} - Pv \right) + Ast/2 \text{ along the semi-major axis of the astigmatism ellipse,}$$

with Ast the astigmatism and the orientation of the astigmatism ellipse being defined by the direction of astigmatism.

There are algorithms for computing the blur in real time on an image using a map of default power. This technique is used in the virtual reality simulator to calculate in real time the blur generated by a design taking into account the proximity of objects in the environment.

An adapted visual environment is determined during the visual environment adapting step S5. The adapted visual environment is based on the combination of the image of the visual environment acquired during the acquisition step and the blur determined during the blur determining step.

According to an embodiment of the invention, the adapted visual environment may be determined by considering further optical effect of the ophthalmic lens than the blur. For example, the distortion introduced by the ophthalmic lens may be considered when determining the adapted visual environment. Other features of the ophthalmic lens such as coating or polarisation effects may also be added to the adapted visual environment.

According to an embodiment of the invention, the optical data received during the optical data receiving step may comprise the distortion map of the ophthalmic lens. The distortion map may be used in combination with the blur determined during the blur determining step to adapt the image of the visual environment.

The adapted visual environment is displayed to the user during the display step S6. The display may be 2D or 3D. The display device may be a computer screen, a TV screen, a computer tablet, a head-mounted display device or of any type known by the skilled person.

The method of the invention may be used to compare the visual effect of different ophthalmic lens. For example, the visual effect of at least two ophthalmic lenses over the visual environment of the user is determined. Adapted visual environments corresponding to each ophthalmic lens are determined and displayed.

Therefore, the user can compare the visual effect of different ophthalmic lenses over his or her visual environment.

According to an embodiment of the invention, at least the acquisition step, the depth map determining step, the blur determining step, the visual environment adapting step, and the display step, are repeated with a frequency of at least 15 Hz, for example at least 20 Hz.

Advantageously, such embodiment provides a real-time visual effect of the ophthalmic lens over the real world scene of the wearer.

The method of the invention is not limited to a real-time mode and may be carried out in a one shot picture mode. According to the one shot picture mode, a picture of the visual environment of the wearer is acquired during the acquisition step and the depth map determining step, the blur determining step, the visual environment adapting step, and the display step are carried out on the picture of the visual environment.

The method according to the invention may be used as a selection method for selecting an ophthalmic lens among a list of available ophthalmic lenses.

Indeed, prior to the optical data receiving step, the method according to the invention may comprise an ophthalmic lens selecting step. During the ophthalmic lens selecting step the type of ophthalmic lens to be demonstrated is selected among a list of ophthalmic lenses. The user may select one or a plurality of ophthalmic lenses for which he wishes to obtain a demonstration of the visual effect. Furthermore, the user may select the type of visual effect his or her is most interested in, for example blur, or blur and distortion etc . . . .

Upon the user's selection optical data corresponding to different ophthalmic lenses and comprising different type of data are received during the optical data receiving step.

The method according to the invention may also be used as an ordering method of ordering an ophthalmic lens. The ordering method may comprise the steps of:
- comparing at least two ophthalmic lenses,
- selecting an ophthalmic lens among the compared ophthalmic lenses,
- sending to a lens provider an order request comprising at least a reference of the ophthalmic lens selected and a reference of the ophthalmic prescription of the wearer.

Advantageously, the user can visualize the visual effect of an ophthalmic lens over the real world prior to ordering the ophthalmic lens.

The invention has been described above with the aid of embodiments without limitation of the general inventive concept. In particular further visual effects may be determined during the visual effect determining step. The blur and/or distortion of the ophthalmic lens are examples of visual effects that may be determined. However, the invention is not limited to determining such visual effects.

Many further modifications and variations will suggest themselves to those skilled in the art upon making reference to the foregoing illustrative embodiments, which are given by way of example only and which are not intended to limit the scope of the invention, that being determined solely by the appended claims.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used. Any reference signs in the claims should not be construed as limiting the scope of the invention.

The invention claimed is:

1. A method implemented by computer for determining a visual effect of an ophthalmic lens, the method comprising:
   an optical data receiving step, during which optical data relating to the optical function of an ophthalmic lens is received, the optical data comprising the optical power map of the ophthalmic lens;
   an acquisition step, during which at least one image of the visual environment of a user is acquired;
   a depth map determining step, during which a depth map of the acquired image of the visual environment of the user is determined; and
   a visual effect determining step, during which based on the depth map and the optical data, a visual effect is determined, the visual effect being the visual effect that is introduced by the ophthalmic lens if the visual environment was seen through the ophthalmic lens.

2. The method according to claim 1, wherein the visual effect comprises the blur and/or the distortion that is introduced by the ophthalmic lens if the visual environment was seen through the ophthalmic lens.

3. The method according to claim 1, wherein the depth map determining step comprises an occlusion filling step during which at least part of the occlusions of the depth map are filled.

4. The method according to claim 1, wherein during the visual effect determining step the visual effect is determined by combining the depth map and the optical power map.

5. The method according to claim 1, wherein the acquisition step, the depth map determining step, the visual effect determining step, are repeated with a frequency of at least 15 Hz.

6. The method according to claim 1, wherein during the acquisition step at least two images of the visual environment of the user are acquired from two different acquisition points.

7. A method, implemented by computer means, for demonstrating to a user the visual effect of an ophthalmic lens, the method comprising:
   an optical data receiving step, during which optical data relating to the optical function of the ophthalmic lens is received, the optical data comprising the optical power map of the ophthalmic lens;
   an acquisition step, during which at least one image of the visual environment of a user is acquired;
   a depth map determining step, during which a depth map of the acquired image of the visual environment of the user is determined; and
   a visual effect determining step during which based on the depth map and the optical data, the visual effect of the ophthalmic lens is determined;
   a visual environment adapting step, during which an adapted visual environment image is determined based on the combination of the image of the visual environment acquired during the acquisition step and the visual effect determined during the visual effect determining step; and
   a display step, during which the adapted visual environment image is displayed to the user.

8. The method according to claim 7, further comprising an optical data receiving step, during which optical data relating to an optical function of an ophthalmic lens is received, wherein the optical data comprises a distortion map of the ophthalmic lens and during the visual environment adapting step, the adapted visual environment image is based on the combination of the image of the visual environment acquired during the acquisition step, the visual effect determined during the visual effect determining step and the distortion map comprised in the optical data.

9. The method according to claim 8, wherein the method comprises prior to the optical data receiving step, an ophthalmic lens selecting step during which the type of ophthalmic lens to be demonstrated is selected among a list of ophthalmic lenses and the optical data related to the optical function of the selected ophthalmic lens.

10. The method according to claim 9, wherein the acquisition step, the depth map determining step, the visual effect determining step, the visual environment adapting step, and the display step, are repeated with a frequency of at least 15 Hz.

11. A computer program product comprising one or more stored sequences of instructions that are stored on a nontransitory computer memory and that are accessible to a processor and which, when executed by the processor, causes the processor to carry out the following steps:

an optical data receiving step, during which optical data relating to the optical function of an ophthalmic lens is received, the optical data comprising the optical power map of the ophthalmic lens;

an acquisition step, during which at least one image of the visual environment of a user is acquired;

a depth map determining step, during which a depth map of the acquired image of the visual environment of the user is determined; and a visual effect determining step, during which based on the depth map and the optical data, a visual effect is determined, the visual effect being the visual effect that is introduced by the ophthalmic lens if the visual environment was seen through the ophthalmic lens.

12. The computer program product according to claim 11, wherein the visual effect comprises the blur and/or the distortion that is introduced by the ophthalmic lens if the visual environment was seen through the ophthalmic lens.

13. The computer program product according to claim 11, wherein the depth map determining step comprises an occlusion filling step during which at least part of the occlusions of the depth map are filled.

14. The computer program product according to claim 11, wherein the acquisition step, the depth map determining step, the visual effect determining step, are repeated with a frequency of at least 15 Hz.

\* \* \* \* \*